United States Patent
Mallinson et al.

(10) Patent No.: US 7,330,138 B2
(45) Date of Patent: Feb. 12, 2008

(54) ASYNCHRONOUS SAMPLE RATE CORRECTION BY TIME DOMAIN INTERPOLATION

(75) Inventors: Andrew Martin Mallinson, Kelowna (CA); Dustin Forman, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 11/479,691

(22) Filed: Jun. 30, 2006

(65) Prior Publication Data

US 2007/0046514 A1    Mar. 1, 2007

Related U.S. Application Data

(60) Provisional application No. 60/712,661, filed on Aug. 29, 2005.

(51) Int. Cl.
    *H03M 7/00* (2006.01)
(52) U.S. Cl. ............ 341/61; 341/133; 341/118; 341/143; 375/232; 375/308
(58) Field of Classification Search .......... 341/61, 341/118, 143, 133; 375/232, 308; 708/300; 381/106
    See application file for complete search history.

(56) References Cited

U.S. PATENT DOCUMENTS

| | | | | |
|---|---|---|---|---|
| 4,378,526 A | * | 3/1983 | Champagne et al. | 341/143 |
| 4,467,316 A | * | 8/1984 | Musmann et al. | 341/144 |
| 5,079,549 A | * | 1/1992 | Liessner | 341/116 |
| 5,121,412 A | * | 6/1992 | Borth | 375/308 |
| 5,140,324 A | * | 8/1992 | Przybysz et al. | 341/133 |
| 5,592,403 A | * | 1/1997 | Trager et al. | 708/300 |
| 5,721,547 A | * | 2/1998 | Longo | 341/118 |
| 5,963,160 A | * | 10/1999 | Wilson et al. | 341/143 |
| 6,064,326 A | * | 5/2000 | Krone et al. | 341/143 |
| 6,240,132 B1 | * | 5/2001 | Yedid | 375/232 |
| 6,504,869 B2 | * | 1/2003 | Yedid | 375/232 |
| 2004/0184621 A1 | * | 9/2004 | Anderson et al. | 381/106 |

\* cited by examiner

*Primary Examiner*—Jean Bruner Jeanglaude
(74) *Attorney, Agent, or Firm*—Kenta Suzue; Haynes Beffel & Wolfeld LLP (57) ABSTRACT

A circuit is provided to correct a sample rate by way of time domain interpolation having a first circuit loop having an up/down counter configured to receive an input signal and a feedback signal and an adder configured to receive the output signal from the up/down counter and to output a carry output as the feedback signal to the up/down counter and a second circuit loop configured to transmit a sum output from the adder to a modulator and to feed back an output signal from the modulator to an input of the adder.

34 Claims, 10 Drawing Sheets

| | $x_j$ | $x_{j+1}$ | $x_{j+2}$ | $x_{j+3}$ | |
|---|---|---|---|---|---|
| Input Data | ⊗ | ⊗ | ⊗ | ⊗ | ... |
| Output Data | | ⊗ | ⊗ | ⊗ | ⊗ ... |
| | | $x_0$ | $x_1$ | $x_2$ | $x_3$ |

FIG. 2B

Prior Art

ASYNCHRONOUS SAMPLE RATE CORRECTION BY TIME DOMAIN INTERPOLATION

RELATED APPLICATIONS

The invention claims the benefit of the filing date for U.S. Provisional Application No. 60/712,661 filed on Aug. 29, 2005.

BACKGROUND

An analog signal is a continuously variable quantity; it has a value at all times and has amplitude that is continuous. A digital approximation to an analog signal is conventionally made by generating a sequence of quantized number (numbers with a finite resolution) each the closest approximation to the analog quantity at regular intervals in time. For example, the digitization of audio signals by a CD player is accomplished by taking samples of so-called "16 bit resolution" at a regular rate of 44.1 Khz. "16 bit resolution" implies that the digital representation of the amplitude is over 16 binary bits and so accurate to about 1/65536 or approximately 16 ppm (parts per million). Another example is the digital audio that is reordered on a DVD disk. In this case the samples of amplitude may be resolved to 24 bits or about 0.06 ppm and the regular rate of taking these samples is at 48 Khz. Therefore, in the audio consumer applications we have at least two different sample rates (44.1 khz and 48 khz) and two different amplitude resolutions (16 and 24 bits) commonly used. FIG. 1A shows an example: here SIGNAL1 is sampled at 44.1 khz and results in the sequence of points marked by the "x". SIGNAL 2 is sampled at a higher rate (48 khz) and results in the sequence of points marked by "o".

The existence of two sampling rates within a system can be inconvenient: consider the case where a stream of digital audio data is arriving from a DVD source at 48 khz and a second stream at 44.1 khz is arriving from an ADC and a microphone source (this situation occurs when a "karaoke" player is using a DVD as a backing instrumental and the ADC is encoding the singer). How shall these two signals be mixed and output through the same audio output device? This is a problem because the input samples are arriving at different times—if the 48 khz source is used to run the digital signal processor (or, more precisely, if the DSP is configured to operate on samples at 48 khz) the samples of the 44.1 khz signal arrive in between the 48 khz samples—they must be delayed or otherwise approximated into the regular rate of the 48 khz in order to processed together. This is the "asynchronous sample rate" conversion problem and this disclosure teaches how samples of a signal arriving asynchronously with relation to some chosen clock can be approximated as a sample at that clock: the asynchronous samples are converted to synchronous samples in a given clock domain that nevertheless accurately represent the signal as it was sampled in the original (now asynchronous relative to the new clock) domain.

It is a requirement of this invention that the chosen clock be at a rate substantially greater than the input sample rate. FIG. 1B shows how a sequence of samples at 44.1 khz may be approximated into a much higher clock rate be performing a "zero order hold" function.

Figure 1B:
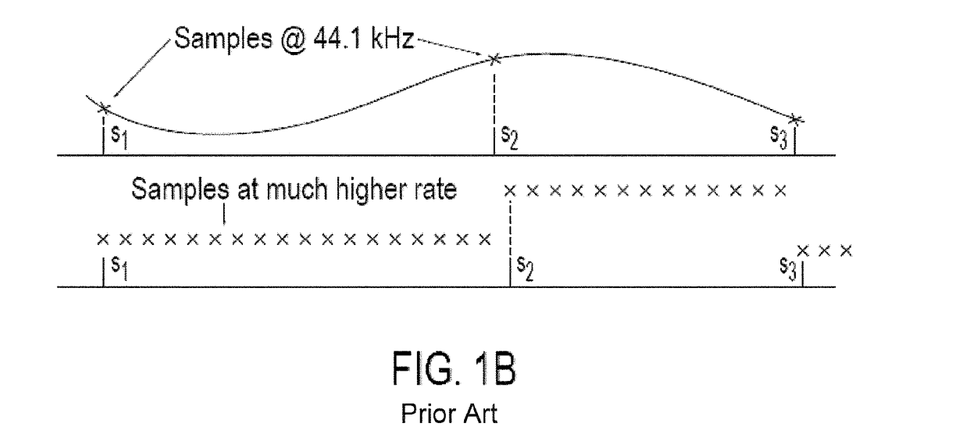
FIG. 1B illustrates the "zero order hold" function.
Figure 2A:
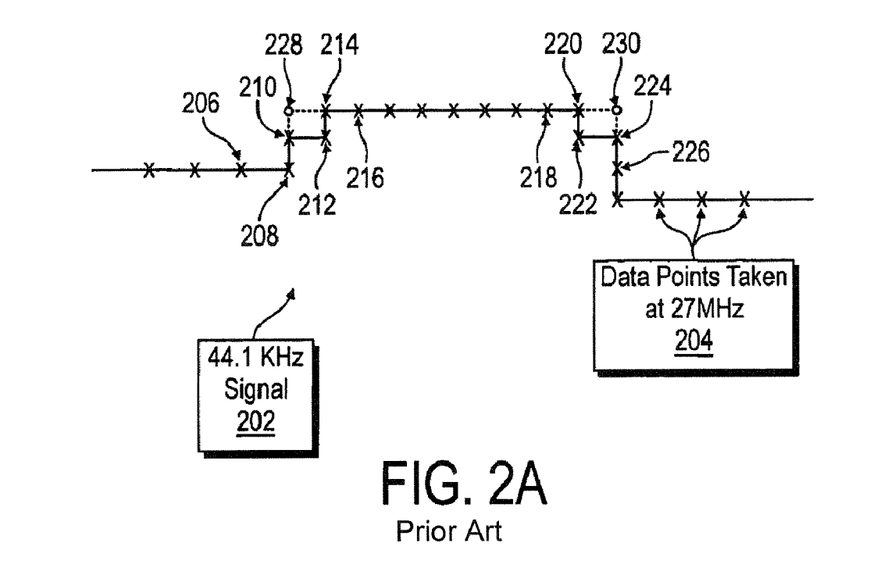

A "zero order hold" function is simply the repetition of the last sample that was seen by the higher speed clock. Note that in FIG. 1B the samples at 44.1 khz do not in general fall at the same time as any of the samples at the higher clock rate. The higher clock rate samples are repetitions of the sample last seen in the 44.1 khz domain. Therefore there is an error: as shown in FIG. 2D—the input sample changed slightly before the first changed sample in the higher clock domain.

Figure 1:
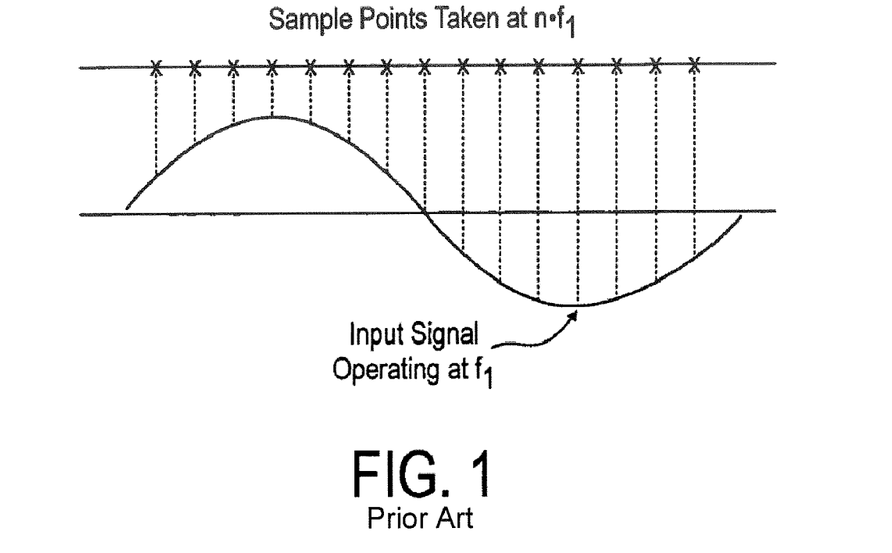
FIGS. 1 and 2A-2K illustrate sample input signals and corresponding sample points.
Figure 1A:
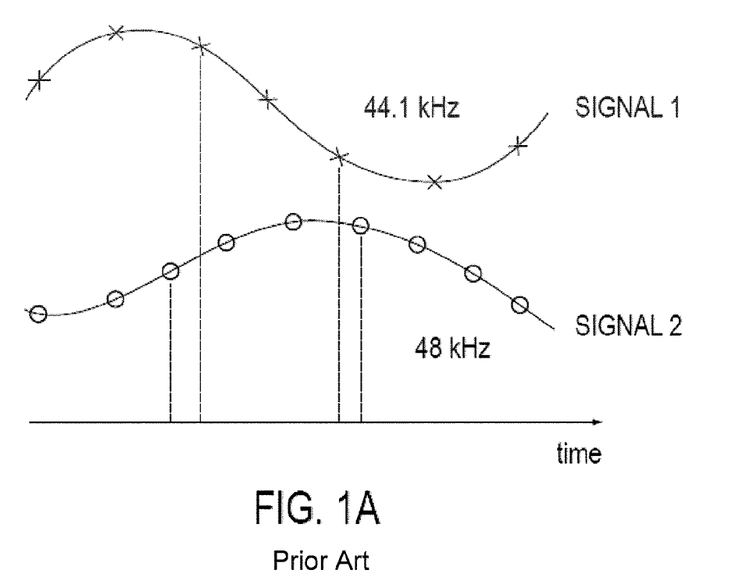
FIG. 1A illustrates the "asynchronous sample rate" conversion problem.

Referring to FIG. 1, a sample analog input signal operating at a frequency "f" is illustrated. In common practice, samples of the signal are taken at sample points, where the number of samples, n, determines the accuracy of the sample. The higher the number of samples, the more accurate reading of the analog signal can be taken. Thus, the frequency of samples taken is much higher than the frequency of the incoming signal. For example, referring to FIG. 2A, if the incoming signal 202 was operating at 44.1 kHz, the data sample points 204 may be taken at 27 MHz.

Errors, however, occur when trying to predict the exact value of a signal at a point. The latency in a circuit that samples the data can cause errors in reading the signal. Sample point 206, for example, is taken in series with previous samples. Sample 208, however is at a transition point, where the next sample, 210 is read at the half way point, then sample 212 is read subsequently, followed by sample points 214 and 216. Continuing, sample point 218 is taken, then sample point 220 is at another transition point. Conventional circuits read point 222, followed by 224 and 226. The actual points from the ideal, however, are corner points 228 and 230. Again, the latency in the circuitry causes artifacts such as these to occur, and for signals to be read in the midst of errors. In conventional systems, an input system would over sample the input to pinpoint f(in), input frequency. This method, however, is inaccurate, and requires expensive circuitry to take more accurate samples.

Figure 2B:
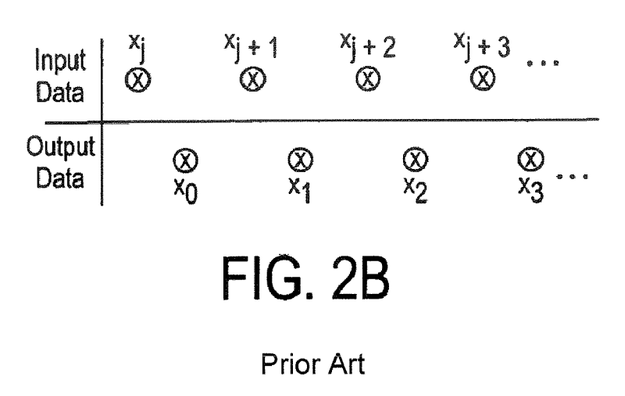
Figure 2C:
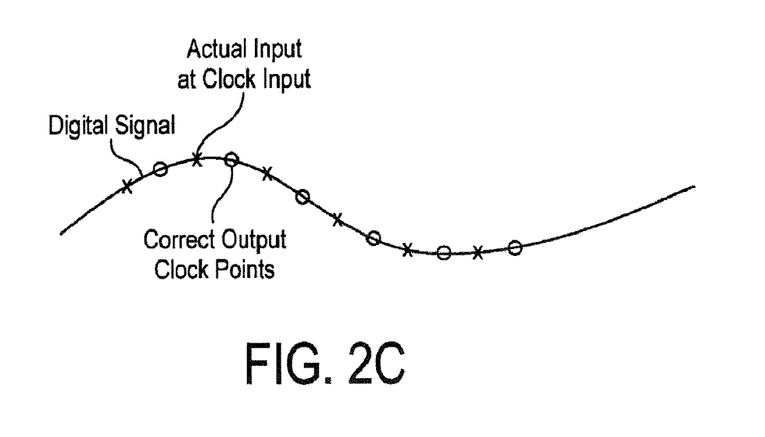
Figure 2D:
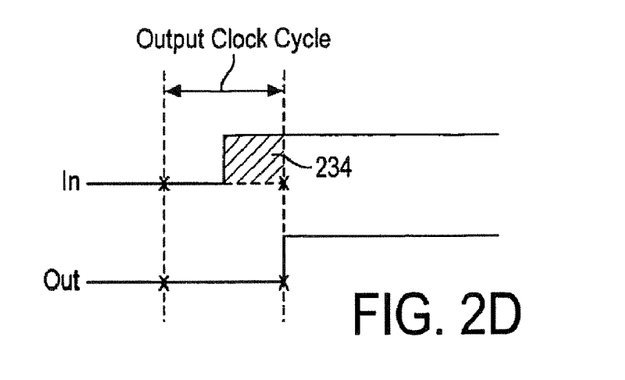

Referring to FIG. 2B, an illustration of input points and output clock points are compared. As can be seen, the output clock points occur after the corresponding input points. Thus, they are at different frequencies. Referring to FIG. 2C, an illustration of a digitized signal is shown, where the x's correspond to the actual input at the input clock. The o's correspond to the correct output clock points. Ideally, the o's will correspond to the output clock signal points. In conventional systems that use synchronous clocks, this is not possible, and signal artifacts result.

Accordingly, there exists a need in the art for a system and method for more accurate sampling of signals, correcting for common artifacts. As will be seen, the invention accomplishes this in an elegant manner.

DETAILED DESCRIPTION

The invention is directed to a signal processing element for performing asynchronous sample rate correction by time domain interpolation. In operation, a digital signal is represented as a stream of digital numbers separated by a fixed and relatively large time interval. This signal is received as an input and processed to generate an output stream of digital numbers separated by a different and relatively shorter time interval. This process operates without introducing artifacts or errors into the newly created signal stream, despite the fact that the time interval between the input data stream and the output data stream is different and may not have any common factors in the respective frequencies.

According to the invention, most samples of the output are simple replicas of the input sample. However, upon detection of a change in the input signal, the output sample is, for one such sample, set to an intermediate value between the old value of input and the new value of output. After generation of this single intermediate sample, the output again replicates what is now the new input sample. Thus, all correction of timing and sampling error is accomplished by the generation of this single intermediate sample that occurs each time the input signal, operating at a lower rate, is detected to have changed.

An interpolated data point will be observed to have been inserted into the output data stream to provide the correction. The value of the intermediate sample is determined from the relative timing of the input sample point between the two output sample points that surround the input sample. The determination of the precise position of the input sample point between the output sample points is determined by logic operating wholly at the output sampling rate. That is, despite the fact that no logic operates any faster that the output sample rate, the invention provides a means to accurately determine the input sample time.

Generally, the invention is directed to a system and method that has three basic characteristics: a faster output clock, determining the point where the input clock changed and performing a time domain interpolation. The purpose is to account for the differences in the input and output data.

Figure 2E:
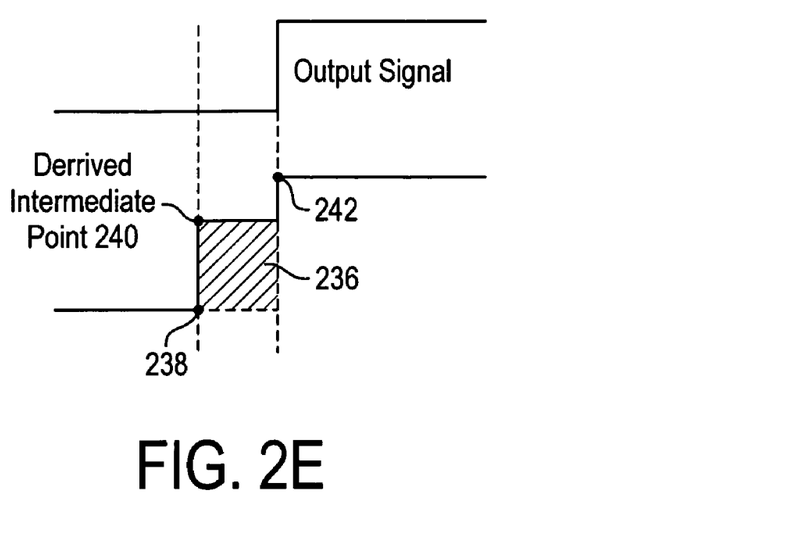

In one embodiment, a faster output clock to better capture the input signal points. In practice, the input clock can fall between the output clocks, and each input clock generates a new sample point. It is possible to simply sample the input upon each cycle of the output clock. However, it is still possible that the retrieved input clock signal value may be missed. Thus, from a graphical view, referring to FIG. 2D, the shaded area 234 is the portion of the input signal that was missed. Thus, the system would need to wait for the next clock cycle. This would be the case in conventional systems. In contrast, according to the invention, this first pass is ignored, and the first cycle would be missed. In the next step, as illustrated in 2E, and intermediate point is generated, which occurs between the high point and low point of the input signal. Thus, point 238 is the prior point from the input signal, point 240 is the derived intermediate point, and point 242 is the new input point. According to the invention, the area 236 shown in FIG. 2E of the new signal has the derived intermediate value. The manner in which this value is derived is discussed further below.

Therefore, If we just use the input sample seen when the input clock is present, an error will occur. The input will not have changed just after the last clock cycle. The shaded area of input is missed. However, the output can be delayed by any number of clock cycles. This will not distort the output. Therefore, the input can be sampled and a delay can occur by one or more clock cycles, such as the example above. This allows a system to insert a point between the old value and the new value. Such a value is inserted at a point such that the area is the same. The output only ever changes on the clock cycle. A system can compensate for the fact that the input did not change in clock by using the intermediate point. In the end result, the areas, such as areas 234 and 236 above, remain the same. This is accomplished in one embodiment by use of a phase locked loop such as that illustrated in FIG. 3.

Figure 3:
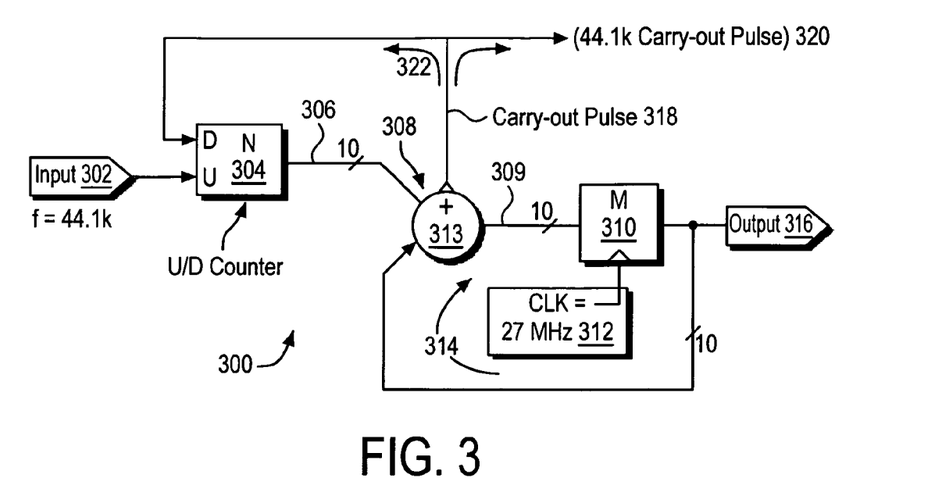
FIG. 3 illustrates a digital phase locked loop configured according to the invention.

Referring to FIG. 3, one embodiment of the invention is illustrated that provides a system configured to pinpoint the frequency by time domain interpolation. A phase locked loop 300 is provided that receives an input signal 302 received at an up/down (U/D) counter control 304 that synchronizes the cycles of an input signal. The up/down counter outputs a signal 306, 10 bits in this particular example, to a modulo accumulator 308. The accumulator 308 forms part of two feedback loops in which the circuit operates. The accumulator outputs a signal 309, again 10 bits in this example, to a modulator 310, which operates according to a clock 312, 27 MHz in this example, and produces a feedback signal that is transmitted through a feedback loop 314, and a corresponding output signal 316. The modulo accumulator outputs a signal 320, which is a carry-out pulse that is output as a 44.1 kHz carry-out signal, and feed back through a feedback loop 322 to the down input of the up/down counter 304. The input signal 302 is fed into the up input of the up/down counter 304.

In operation, the input signal operating at a first frequency, for example 44.1 kHz, is input into the up input of the up/down counter. The output of the up/down counter is transmitted to one input of an adder. The output of the modulo accumulator is input into a modulator, clocked at a second frequency, 27 MHz for example, and the output of the modulator produces a first output "M" of the circuit, and is also fed back as the second input of the adder. The adder has a carry output that is fed back to the "down" input of the up/down counter. The carry output resets the up/down counter upon an overflow from the adder, resetting the front edge of the output signal, the second output. The adder adds the output, a 10 bit output for example, of the counter to the 10 bit output signal from "M". Thus, the point of the sample rate is determined by the formula $x_0 = x_N + (M/N)(x_{N+1} - x_N)$; where M/N is the error in timing.

The determination of the input sample time is made as follows. First, a modulo accumulator 308 is configured to add, at the output clock rate 312, an input 313 to a running total. The accumulator 308 may be configured as a digital adder and register operating with a finite integer width, or other known additive device configured to accumulate an increasing value. The running total will ultimately overflow to generate an output pulse 320, as the adder is of finite width and will eventually max out and overflow. According to the invention, the frequency rate of the overflows 320 from the modulo accumulator 308 is compared to the rate of arrival of input samples 305. If the rate of arrival of input samples exceeds the rate of overflows of the accumulator, the input to the adder 313, which is the amount that is added each cycle of the output, is increased. Conversely, if the rate of arrive of input samples is less than the rate of overflows from the counter, the input to the adder is decreased. Therefore, a control loop 314 exists, where the input to the adder will settle to a value such that the rates are equal.

Figure 4:
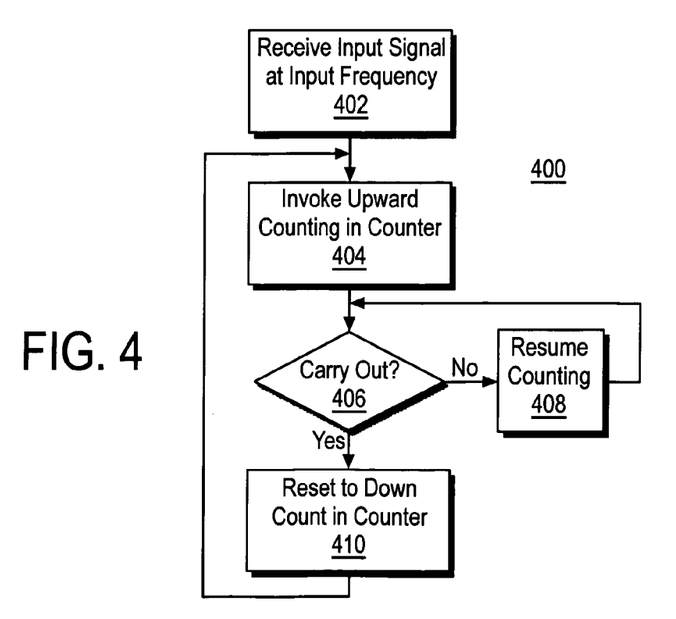
FIG. 4 is a flow chart illustrating a method according to the invention.

Referring to FIG. 4, a flow chart 400 is illustrated that generally describes the operation of the circuit 300. An input signal operating at an input frequency is received at step 402. The upward counting is invoked in the up/down counter in step 404. In step 406, it is determined whether there is a carry-out pulse. If there is no carry out, the process resumes counting in step 408. Once, a carry out occurs, the process moves to step 410 where the up/down counter is reset to a down count, the baseline value B in FIG. 5.

Initially the number in the counter is zero (318. FIG. 3 is the counter output), so the adder never overflows. The adder is adding zero. However, eventually an input signal increments the counter. Now, the adder must eventually overflow. Moreover, the counter will only reach equilibrium when the rate of the overflows of the adder equals the rate of the input clocks. For example, if the input clock rate is 48 KHZ, the output clock rate is 1 MegH2 and the buss width is N=20, then the counter with stop moving when the number is the following:

$$\frac{44e^3}{1E^6} \times 220 = 46137$$

This is because, at this number, the adder overflow rate is $46137/2^{20} \times 1$ mhz=44 $e^3$. Therefore, there are just as many 'down counts' as 'up counts' to the counter.

Figure 2F:
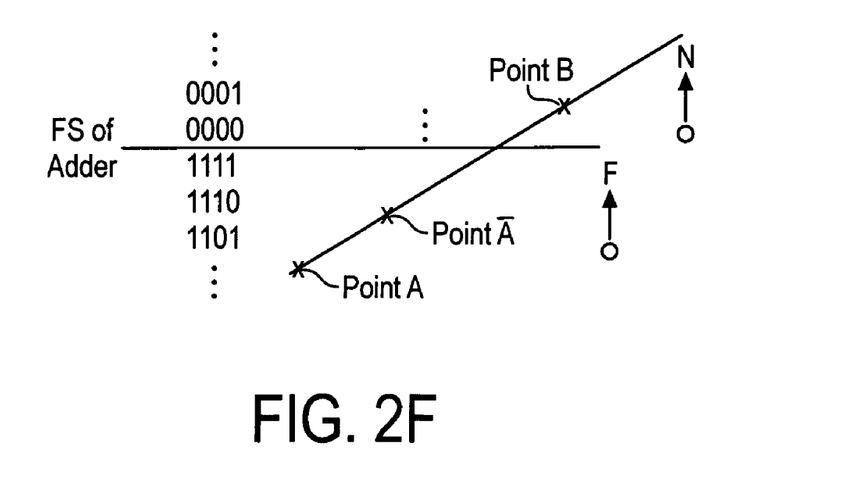

It is observed that when the system described is locked, when the number in the counter has substantially settled, the number in the register at the time of arrival of the input clock represents the error in position of the input. More particularly, when a carry out occurs, the system looks at the number in the register. It just exceeded full scale. And, that is why there was an overflow. Referring to FIG. 2F, the number (A), the counter number, was just added to the number in the register. Therefore, the number now in the register is some number less than A. FIG. 2F illustrates the number in the register, FS is shown. Each time it adds (A) to the total, at some point, it exceeds FS by B, B must be less than A. In this embodiment, the number in the counter is N, and the amount by which the register overflows is M.

Figure 2G:
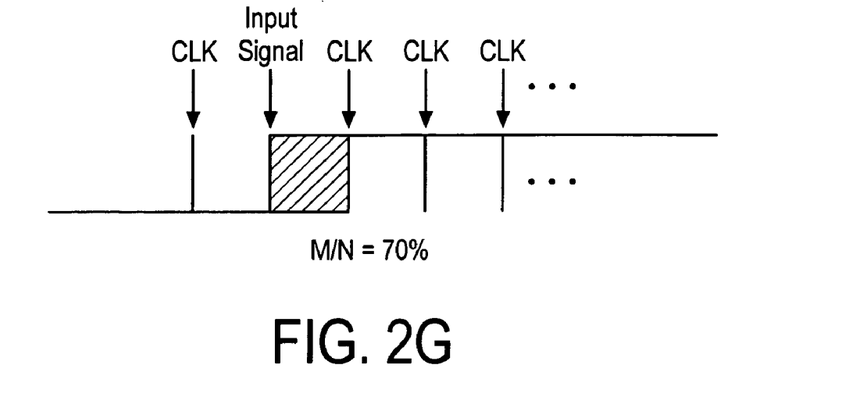
Figure 2H:
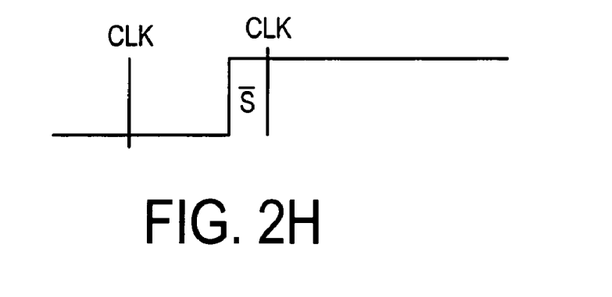
Figure 2I:
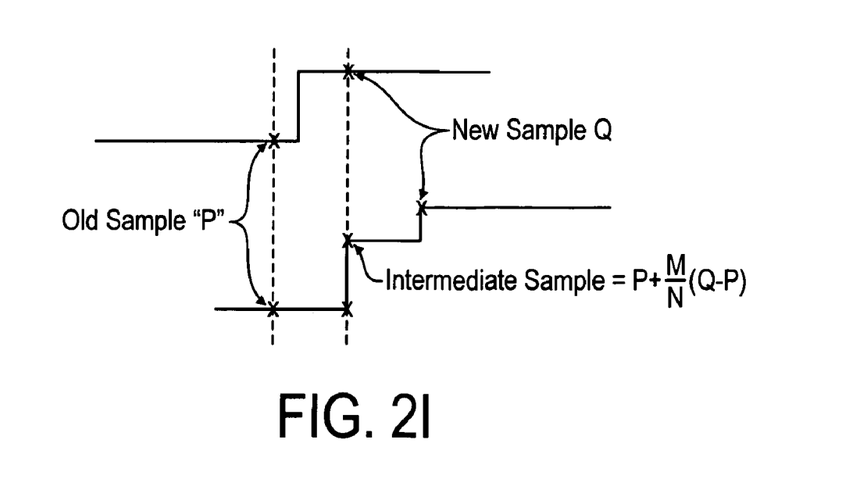

Referring to FIG. 2G, it is observed that the quantity of M/N is the error in the sample time. This is further shown in FIG. 2H. Therefore, this is where the system can know where the input clock point was located, it looks at M/N in the loop discussed above and illustrated in FIG. 3. Referring to FIG. 2I, It is illustrated that the intermediate sample is derived by the old sample P and the old sample Q. The intermediate sample is $$S=P+M/N(Q-P).$$

Again, the system can now know where the input clock position was and can derive the intermediate point S from those values. The system inserts a single sample into the output stream. It is intermediate between the last sample of the input and the next sample of the input. It is calculated by locking the digital look to the input and the output clock. 'M' is the amount by which the loop register overflows and 'N' is the number in the loop counter. The intermediate sample is S=P+M/N(Q-P).

The invention exploits the observation that the position of the input sample may be determined by the residual number preset in the accumulator just after overflow. The amount at which it overflows is proportional to the position of the signal in time with respect to the clock. Specifically, upon detection of the overflow in the modulo accumulator, the residue, which is the number remaining in the finite width accumulator, is recognized to be proportional to the relative position of the input sample rate between samples at the output rate. Thus, the position is determined and the intermediate sample may be generated using this determination without any logic operating any faster than the output sample rate clock.

Figure 5:
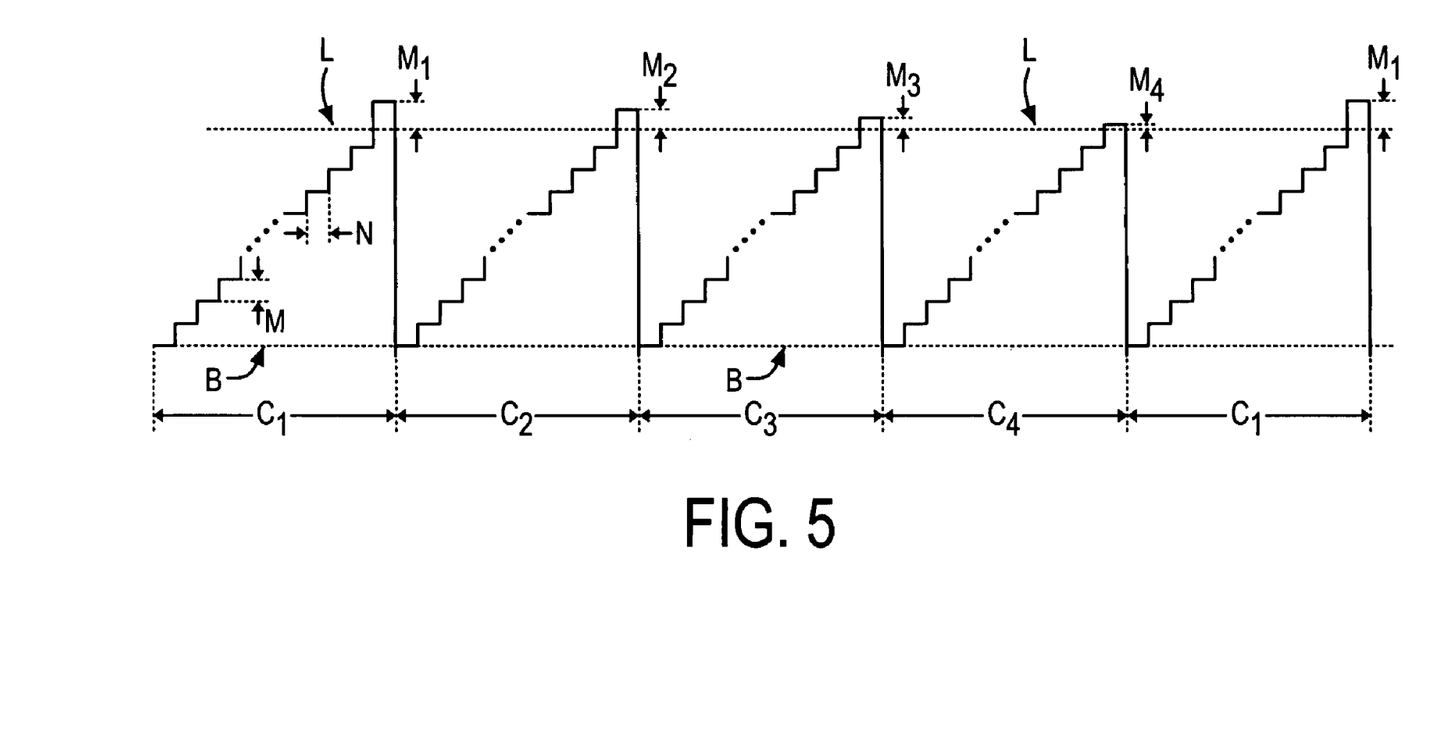
FIG. 5 is a timing diagram illustrating the operation of the output of the circuit of FIG. 1.

Referring to FIG. 5, a timing diagram of a compensated signal is illustrated. In operation, the over cycle of the process is repetitive, C1-C4 in this example, which repeats every 4 cycles. In the particular example illustrated, there are four channels. Those skilled in the art will understand that there can be more or less channels as particular applications may be desired. The duration of each channel is determined by dividing the modulo adder clock frequency 312 by the signal frequency, as in this example: 27 MHz/44.1 kHz=612.25. Thus, each of C1-C4 is substantially equal The accumulator accumulates in increments the size M, over a time span N at each step. Once the modulo accumulator overflows in an amount over the maximum limit L, the circuit resets back to the minimum baseline B. According to the invention, the amount of overflow of each stage, M1-M4, is used to determine a more accurate point of transition of the incoming signal. It is observed that this value changes, and may even decrease over time, as in the example illustrated in FIG. 5. In practice, the error decreases by setting the sample points every 612.25 ms.

Figure 2J:
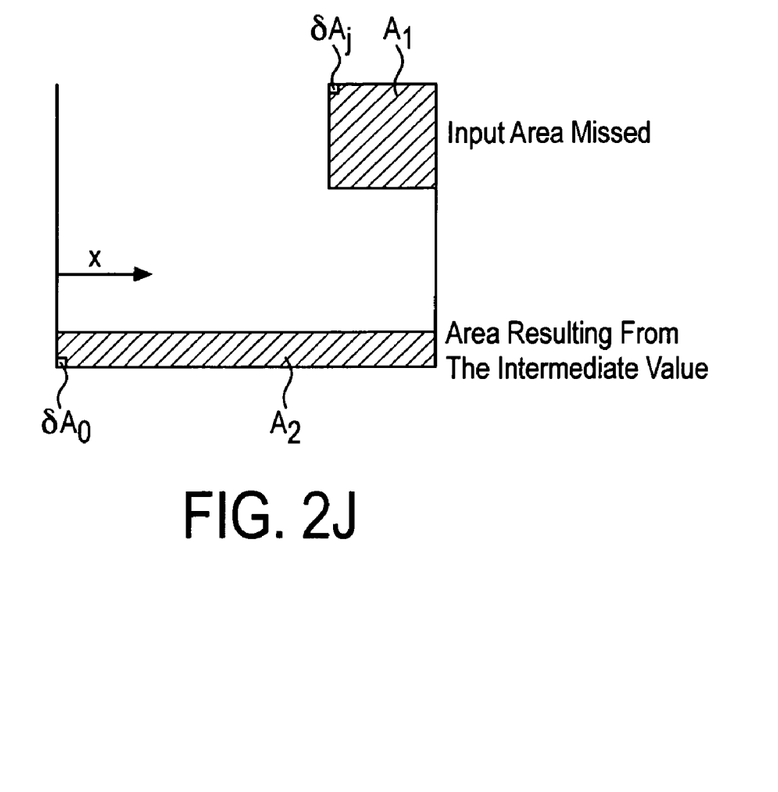
Figure 2K:
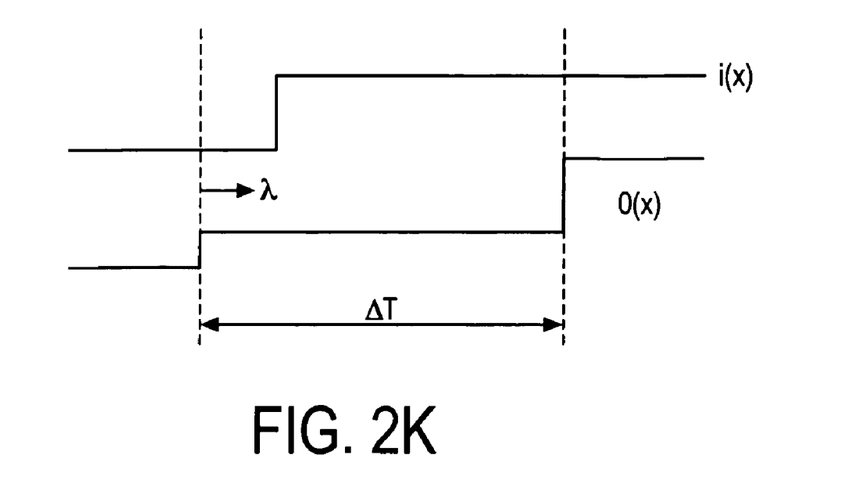
Figure 6:
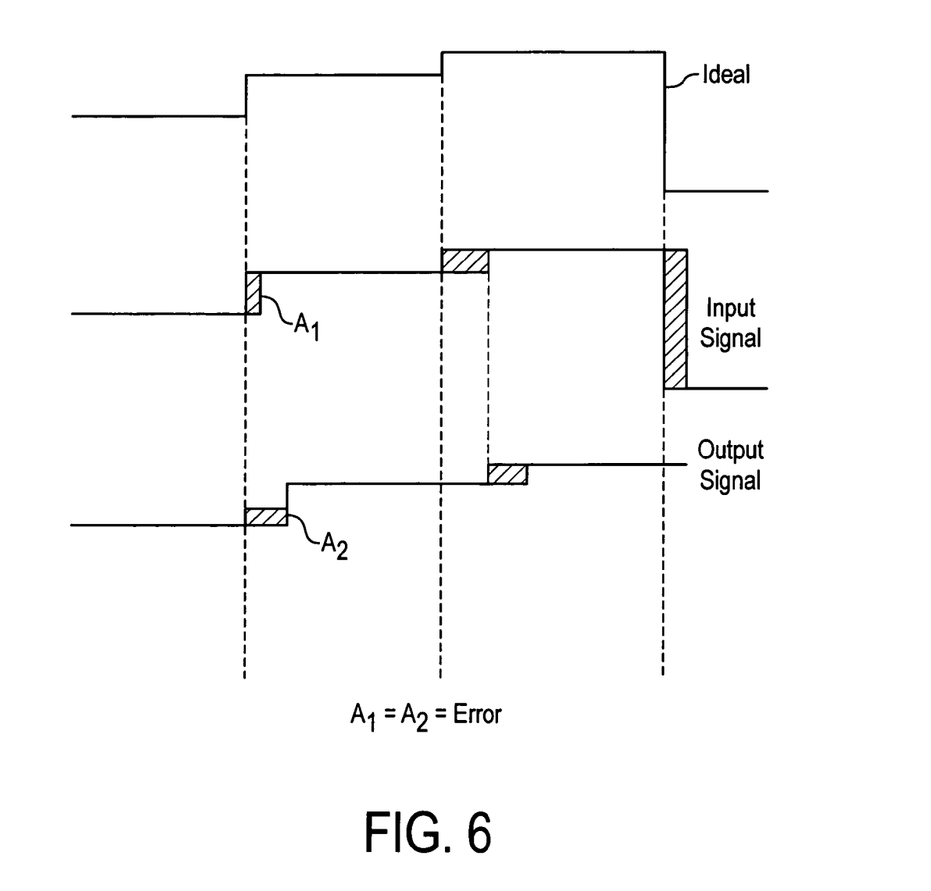
FIG. 6 illustrates a graph illustrating error factors.

Area defines area of compensation. More particularly, referring to FIG. 6, $A_1$ is the area of the input, and $A_2$ is the area about the intermediate point. Each area is made up of small area samples, and the sum of the areas are the same. Referring to FIG. 2J, the input signal area is made up of the sum of $\delta A_i$'s from the input, and the output signal area is made up of $\delta A_i$'s from the sum of from the output signal. However, the centers of gravity of the areas are not the same, which is evident from the areas samples shown in FIG. 2J. Referring to FIG. 2K, a mathematical explanation can be derived. If i(x) is the input signal, and x is the distance from the start of the interval, and o(x) is the output signal. The intervals are arranged such that $$\int_0^{\Delta T} i(x)\delta x = \int_0^{\Delta T} o(x)\delta x$$

The area under the curve is the same, however, $$\int_0^{\Delta T} xi(x)\delta x \neq \int_0^{\Delta T} xo(x)\delta x$$

This expression is the center of gravity of the first moment of the function. They do not match in the separate areas. However, according to the invention, with two intermediate points, the first moment can be matched as follows:

$$\int_0^{2\Delta T} i(x)\delta x = \int_0^{2\Delta T} o(x)\delta x \text{ and } \int_0^{2\Delta T} xi(x)\delta x = \int_0^{2\Delta T} xo(x)\delta x$$

Figure 7:
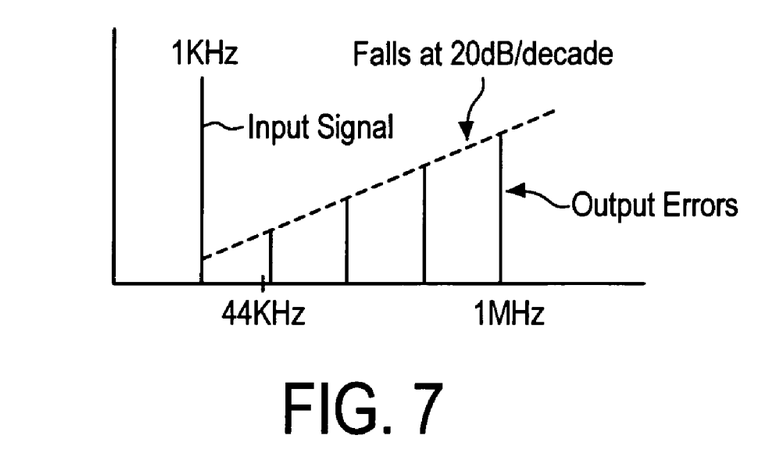
FIG. 7 is a graph showing the error frequency with a 20 dB/decade slope.
Figure 8:
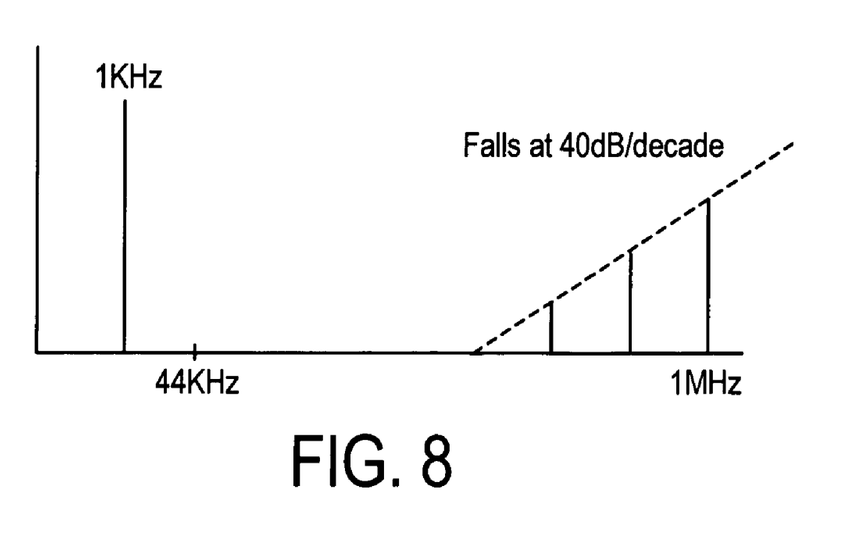
FIG. 8 is a graph showing the error frequency with a 40 dB/decade slope.

Therefore, each additional moment matched increases the order of the approximation made. In the frequency domain, referring to FIG. 7, if the areas are matched, the error frequency falls at 20 dB/decade. Furthermore, referring to FIG. 8, if the moments of each area are matched, the error frequency falls at 40 dB/decade.

Therefore, the invention provides a system that can have an $n^{th}$ order tome domain asynchronous signal rage converter (ASRC) interpolator. This is accomplished by using a digital locked loop to find the actual input change. The arbitrary high order frequency of error is cancelled by using intermediate samples.

The invention claimed is:
1. A circuit configured to correct a sample rate by way of time domain interpolation, comprising:

a first circuit loop having an up/down counter configured to receive an input signal and a feedback signal and an adder configured to receive a counter output signal from the up/down counter and to output a carry output as the feedback signal to the up/down counter; and a second circuit loop configured to transmit a sum output from the adder to a modulator and to feed back a modulator output signal from the modulator to an input of the adder.

2. A method of correcting a sample rate by receiving an input signal operating at a first frequency;

transmitting the input signal into an up input of an up/down counter;

transmitting an output signal from the up/down counter to a first input of an adder;

transmitting output of the adder into a modulator, where the modulator is clocked at a second frequency, and wherein the modulator produces a modulator output that is fed back as a second input of the adder; and if an overflow occurs at the adder, transmitting a carry output from the adder that is fed back to a down input of the up/down counter to reset the up/down counter.

3. The method according to claim 2, further comprising:

adding the output signal of the up/down counter to the modulator output from the modulator using the adder.

4. A circuit configured to correct sample rates by way of time domain interpolation, comprising:

a first circuit loop having a first up/down counter configured to receive a first input signal at a first input frequency and a first feedback signal and a first adder configured to receive a first counter output signal from the first up/down counter and to output a first carry output as the first feedback signal to the first up/down counter;

a second circuit loop configured to transmit a first sum output from the first adder to a first modulator and to feed back a first modulator output signal from the first modulator to a first input of the first adder, wherein the first modulator output signal has a first output frequency greater than the first input frequency;

a third circuit loop having a second up/down counter configured to receive a second feedback signal and a second input signal at a second input frequency different from the first input frequency and a second adder configured to receive a second counter output signal from the second up/down counter and to output a second carry output as the second feedback signal to the second up/down counter; and a fourth circuit loop configured to transmit a second sum output from the second adder to a second modulator and to feed back a second modulator output signal from the second modulator to a second input of the second adder, wherein the second modulator output signal has the first output frequency greater than the second input frequency.

5. A method of correcting a sample rate by receiving a first input signal operating at a first input frequency;

transmitting the first input signal into a first up input of a first up/down counter;

transmitting a first output signal from the first up/down counter to a first input of a first adder;

transmitting output of the first adder into a first modulator, where the first modulator is clocked at a first output frequency greater than the first input frequency, and wherein the first modulator produces a first modulator output that is fed back as a second input of the first adder; and if an overflow occurs at the first adder, transmitting a first carry output from the first adder that is fed back to a first down input of the first up/down counter to reset the first up/down counter;

receiving a second input signal operating at a second input frequency;

transmitting the second input signal into a second up input of a second up/down counter;

transmitting a second output signal from the second up/down counter to a first input of a second adder;

transmitting output of the second adder into a second modulator, where the second modulator is clocked at the first output frequency greater than the second input frequency, and wherein the second modulator produces a second modulator output that is fed back as a second input of the second adder; and if an overflow occurs at the second adder, transmitting a second carry output from the second adder that is fed back to a second down input of the second up/down counter to reset the second up/down counter.

6. The method according to claim 5, further comprising:

adding the first output signal of the first up/down counter to the first modulator output from the first modulator using the first adder.

7. The method according to claim 5, further comprising:

adding the second output signal of the second up/down counter to the second modulator output from the second modulator using the second adder.

8. The method according to claim 5, further comprising:

adding the first output signal of the first up/down counter to the first modulator output from the first modulator using the first adder; and adding the second output signal of the second up/down counter to the second modulator output from the second modulator using the second adder.

9. The circuit of claim 4, wherein the first input frequency is 44.1 kHz.

10. The circuit of claim 4, wherein the second input frequency is 48 kHz.

11. The circuit of claim 4, wherein the first output frequency is 27 MHz.

12. The method of claim 5, wherein the first input frequency is 44.1 kHz.

13. The method of claim 5, wherein the second input frequency is 48 kHz.

14. The method of claim 5, wherein the first output frequency is 27 MHz.

15. The circuit of claim 4, further comprising:

circuitry mixing the first modulator output signal having the first output frequency with the second modulator output signal having the first output frequency.

16. The method of claim 5, further comprising:

mixing the first modulator output having the first output frequency with the second modulator output having the first output frequency.

17. A circuit, comprising:

a first circuit loop having a first up/down counter configured to receive a first input signal at a first input frequency and a first feedback signal and a first adder configured to receive a first counter output signal from the first up/down counter and to output a first carry output as the first feedback signal to the first up/down counter;

a second circuit loop configured to transmit a first sum output from the first adder to a first modulator and to feed back a first modulator output signal from the first modulator to a first input of the first adder, wherein the first modulator output signal has a first output frequency greater than the first input frequency;

circuitry mixing the first modulator output signal having the first output frequency with a mixer input signal having the first output frequency, wherein the mixer input signal was processed from a second input signal having a second input frequency less than the first output frequency.

18. The circuit of claim 17, wherein the first input frequency is 44.1 kHz.

19. The circuit of claim 17, wherein the first input frequency is 48 kHz.

20. The circuit of claim 17, wherein the first output frequency is 27 MHz.

21. A method, comprising:

receiving a first input signal operating at a first input frequency;

transmitting the first input signal into a first up input of a first up/down counter;

transmitting a first output signal from the first up/down counter to a first input of a first adder;

transmitting output of the first adder into a first modulator, where the first modulator is clocked at a first output frequency greater than the first input frequency, and wherein the first modulator produces a first modulator output that is fed back as a second input of the first adder;

if an overflow occurs at the first adder, transmitting a first carry output from the first adder that is fed back to a first down input of the first up/down counter to reset the first up/down counter; and mixing the first modulator output having the first output frequency with a mixer input signal having the first output frequency, wherein the mixer input signal was processed from a second input signal having a second input frequency less than the first output frequency.

22. The method according to claim 21, further comprising:

adding the first output signal of the first up/down counter to the first modulator output from the first modulator using the first adder.

23. The method of claim 21, wherein the first input frequency is 44.1 kHz.

24. The method of claim 21, wherein the first input frequency is 48 kHz.

25. The method of claim 21, wherein the first output frequency is 27 MHz.

26. The method of claim 1, wherein the input signal is an audio signal.

27. The method of claim 2, wherein the input signal is an audio signal.

28. The method of claim 4, wherein the first input signal is an audio signal.

29. The method of claim 4, wherein the second input signal is an audio signal.

30. The method of claim 5, wherein the first input signal is an audio signal.

31. The method of claim 5, wherein the second input signal is an audio signal.

32. The method of claim 17, wherein the first input signal is an audio signal.

33. The method of claim 21, wherein the first input signal is an audio signal.

34. The method of claim 21, wherein the second input signal is an audio signal.

* * * * *